(12) United States Patent
Varnica et al.

(10) Patent No.: US 8,429,483 B1
(45) Date of Patent: Apr. 23, 2013

(54) EDGE-BASED DECODERS FOR LOW-DENSITY PARITY-CHECK CODES

(75) Inventors: Nedeljko Varnica, Sunnyvale, CA (US); Seo-How Low, San Jose, CA (US); Lingyan Sun, Longmont, CO (US); Zining Wu, Los Altos, CA (US)

(73) Assignee: Marvell International Ltd., Hamilton (BM)

( * ) Notice: Subject to any disclaimer, the term of this patent is extended or adjusted under 35 U.S.C. 154(b) by 1010 days.

(21) Appl. No.: 12/334,160

(22) Filed: Dec. 12, 2008

Related U.S. Application Data

(60) Provisional application No. 61/013,146, filed on Dec. 12, 2007.

(51) Int. Cl.
*G06F 11/00* (2006.01)
(52) U.S. Cl.
USPC .......................................... 714/752; 714/780
(58) Field of Classification Search .................. None
See application file for complete search history.

(56) References Cited

U.S. PATENT DOCUMENTS

| | | | | |
|---|---|---|---|---|
| 2005/0229090 | A1* | 10/2005 | Shen et al. | 714/801 |
| 2007/0089016 | A1* | 4/2007 | Bhatt et al. | 714/752 |
| 2007/0162816 | A1* | 7/2007 | Kim et al. | 714/752 |
| 2008/0235561 | A1* | 9/2008 | Yang | 714/801 |

OTHER PUBLICATIONS

M. Luby, M. Mitzenmacher, M. A. Shokrollahi, and D. A.Spielman. "*Improved Low-Density Parity-Check Codes Using Irregular Graphs*", IEEE Transactions on Information Theory, vol. 47(2), pp. 585-598, Feb. 2001.

T. Richardson and R. Urbanke. "*The Capacity of Low-Density Parity-Check Codes Under Message-Passing Decoding*", IEEE Transactions on Information Theory, vol. 47, Feb. 2001.

T. Richardson, M. A. Shokrollahi, and R. Urbanke, "*Design of capacity-approaching irregular low-density parity-check codes,*" IEEE Transactions on Information Theory, vol. 47, pp. 619-637, Feb. 2001.

X.-Y. Hu, E. Eleftheriou, and D.-M. Arnold, "*Regular and irregular progressive edge-growth tanner graphs,*" IEEE Transactions on Information Theory, vol. 51(1), pp. 386-398, Jan. 2005.

\* cited by examiner

*Primary Examiner* — Scott Baderman
*Assistant Examiner* — Jason Bryan

(57) ABSTRACT

Systems, methods, and apparatus are provided for increasing decoding throughput in an LDPC decoder, such as in a wireless communications receiver or in a data retrieval unit. A checker-board parity check matrix and edge-based LDPC decoder structure are provided in which both vertical and horizontal processors are used simultaneously. Horizontal processors may be grouped into type-A and type-B horizontal processors, and similarly, vertical processors may be grouped into type-A and type-B vertical processors. Type-A processors may be used in different clock cycles than type-B processors to update memory locations in a decoding matrix without causing memory access conflicts.

18 Claims, 12 Drawing Sheets

EDGE-BASED DECODERS FOR LOW-DENSITY PARITY-CHECK CODES

CROSS-REFERENCE TO RELATED APPLICATIONS

This claims the benefit under 35 U.S.C. §119(e) of U.S. Provisional Application No. 61/013,146, filed Dec. 12, 2007, which is hereby incorporated by reference herein in its entirety.

BACKGROUND OF THE DISCLOSURE

LDPC error correcting codes ("LDPC codes") can be employed by communication and/or data storage systems to detect and correct errors in data. LDPC codes may be implemented by using an encoding process at a transmitter, in which redundancy is added to data, and a decoding process at a receiver, in which the added redundancy is exploited to correct errors. The effectiveness of an LDPC code may be characterized by the number of errors per encoded data block that it is capable of correcting. For example, an LDPC code may be able to correct up to t symbol errors, wherein t is a positive integer number that depends on the length of an original data block, the length of the coded data block, and on other parameters. LDPC codes are often able to correct a large fraction the errors present in a received codeword, and this leads to improved end-to-end reliability.

LDPC codes may be decoded using iterative message passing algorithms, such as min-sum decoding algorithms or sum-product algorithms. Such algorithms may decode a received codeword using an iterative process, in which each iteration includes two update steps. In the first update step, messages may be passed from check nodes to symbol nodes, and in the second update step, messages may be passed from symbol nodes to check nodes. These two steps are generally performed sequentially, rather than in parallel to avoid memory access conflicts in the LDPC decoder architecture. Sequential processing has the drawback of reducing the decoder throughput, i.e., the amount of time the decoder requires to decode a received codeword. This reduced decoder throughput is generally undesirable. If the decoding throughput is not sufficiently large, then applications may not perform as intended or desired. An insufficient decoding throughput can lead to degraded application performance, interruptions in service while codewords are queued waiting to be decoded at the receiver, and/or a lowered data transmission rate.

Therefore, there exists a need for LDPC decoder architectures in which the decoding throughput can be increased. For example, there exists a need for decoding architectures in which the first and second steps of an iterative decoding algorithm may be run simultaneously, without degrading the error-correcting performance of the decoder. The increased decoding throughput provided by such a decoding architecture may lead to improved application performance, fewer interruptions in service, and/or larger data transmission rates.

SUMMARY OF THE DISCLOSURE

In accordance with certain aspects of the invention, systems, methods, and apparatus for increasing the decoding throughput of an edge-based LDPC decoder are provided.

One aspect of the invention relates to methods for decoding an LDPC codeword by iteratively processing symbol node messages and parity check node messages that are generated from a received LDPC codeword. According to one embodiment, the decoding operation is performed using a checker-board matrix that includes memory locations corresponding to edges in a Tanner graph representation of the LDPC code. The checker-board representation preferably permits simultaneous access to memory locations corresponding to symbol node messages and parity check node messages, without creating memory access conflicts in the LDPC decoder. Simultaneous access to memory locations improves the decoding throughput of the corresponding LDPC decoder. The methods presented herein may be implemented using a wide range of iterative decoding algorithms including belief propagation algorithms such as the min-sum decoding algorithm and the sum-product decoding algorithm.

One aspect of the invention relates to techniques for implementing an edge-based LDPC decoder having an improved decoding throughput. According to one embodiment, the implementation includes a checker-board parity check matrix structure that contains a number of square circulant submatrices arranged in a checker-board pattern. Edge messages, e.g., log likelihood ratios (LLRs), corresponding to one circulant submatrix may for example be stored in one memory block. Edge messages corresponding to another circulant submatrix may, for example, be stored in another memory block. Note that there are no edge messages corresponding to all-zero circulants and hence no memory blocks are needed for such circulants. The memory locations are accessed using two sets of horizontal processors and two sets of vertical processors that operate according to an iterative decoding algorithm. Each set of horizontal processors includes $m_h$ horizontal processors (per circulant-row) running in parallel may be used to access the memory locations corresponding to each non-zero circulant matrix having an odd numbered row index or even numbered row index (but not both), and each set of vertical processors includes $m_v$ vertical processors (per circulant-column) running in parallel may be used to access the memory locations corresponding to each non-zero circulant matrix having an even numbered column index or odd numbered column index (but not both) in the parity check matrix structure. These techniques preferably permit horizontal and vertical processors to be used simultaneously in any clock cycle to access and modify the contents of memory locations corresponding to the parity check matrix structure, thereby increasing the decoding throughput of the LDPC code.

One aspect of the invention relates to methods for selecting a suitable LDPC parity check matrix for edge-based decoding by generating a LDPC parity check matrix, determining the performance of the LDPC parity check matrix, and generating a new LDPC parity check matrix if the performance is determined to be unsuitable. According to one embodiment, generating the parity check matrix involves selecting the dimensions of the LDPC parity check matrix and the number of horizontal processors $m_h$ and vertical processors $m_v$ used to access memory locations in the LDPC decoder. The contents of the LDPC parity check matrix are generated using, for example, a density evolution algorithm and/or a progressive-edge-growth algorithm. In various embodiments, performance is tested either in software or in hardware, for example, using a field programmable gate array. In various embodiments, performance may be measured using the symbol-error rate, bit-error rate, sector-error rate, and/or the decoding throughput.

One aspect of the invention relates to apparatus for determining a LDPC code by selecting a first set of locations for matrix sub-blocks in a quasi-cyclic LDPC parity check matrix structure, placing non-zero matrix sub-block so that no non-zero matrix sub-block is located adjacent to another non-zero matrix sub-block, placing all-zero blocks so that no all-zero block is located adjacent to another all-zero block, and generating a quasi-cyclic LDPC parity check matrix structure using the locations of the matrix sub-blocks and all-zero blocks.

One aspect of the invention relates to apparatus for decoding a LDPC codeword by obtaining a received codeword that has been generated from an LDPC code, determining soft information from the received codeword, generating symbol node messages and parity check node messages based on the soft information, and iteratively processing the symbol node messages and parity check node messages. According to one embodiment, each iteration of the iterative processing may include updating the symbol node messages simultaneously with the parity check node messages to produce processed soft information.

Further features of the invention, its nature and various advantages will be more apparent from the accompanying drawings and the following detailed description.

BRIEF DESCRIPTION OF THE FIGURES

The above and other advantages of the invention will be apparent upon consideration of the following detailed description, taken in conjunction with the accompanying drawings, in which like reference characters refer to like parts throughout, and in which.

DETAILED DESCRIPTION OF THE DISCLOSURE

Figure 1:
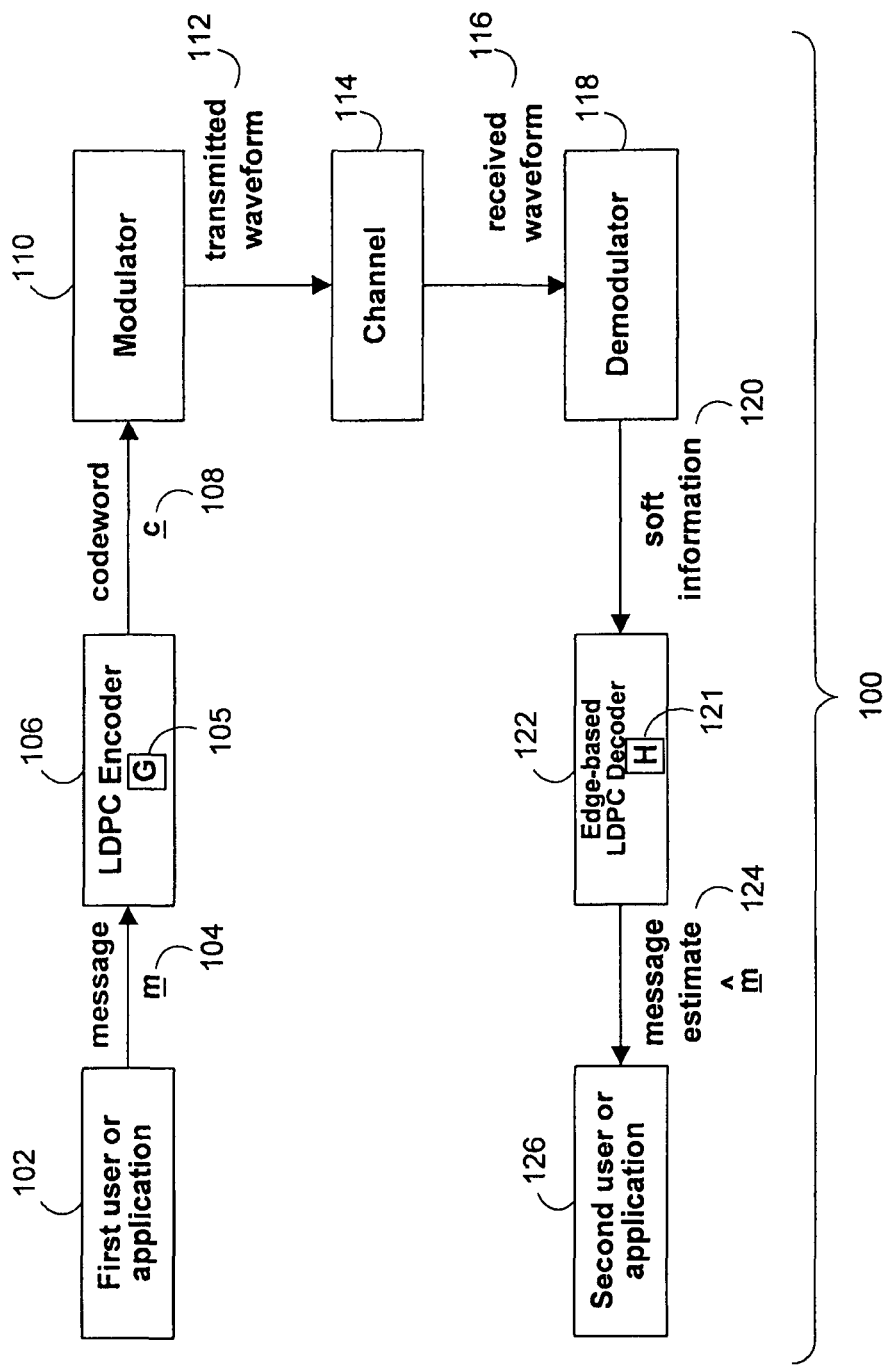
FIG. 1 shows an illustrative communications system employing an LDPC encoder and edge-based LDPC decoder in accordance with some embodiments.

FIG. 1 shows an illustrative communications system 100 employing an LDPC encoder 106 and edge-based LDPC decoder 122 in accordance with some embodiments. First user or application 102 may produce a data stream that is to be transmitted to second user or application 126. First user or application 102 may correspond to a single communications entity or to multiple communications entities. For example, first user or application 102 may correspond to a software program in a computer system. The data stream may be represented by a sequence of symbol values that have been pre-processed by a source encoder (not shown). The data stream may correspond to voice information, video information, financial information, or at least any other type of information that can be represented in digital form.

The data stream may be divided into blocks of a certain fixed length, and each fixed block may be referred to as message 104. Message 104 will also be referred to as m. Message 104 may be of length k, meaning that message 104 is comprised of k symbols, where each symbol may be binary data, ternary data, quaternary data, or any other suitable type of data. LDPC encoder 106 encodes message 104 using generator matrix 105 to produce codeword 108. Generator matrix 105 will also be referred to as G, and codeword 1080 will also be referred to as c. Codeword 1080 may be of length n, where n≧k. Codeword 1080 may be input to modulator 110. Modulator 110 transforms codeword 1080 into transmitted waveform 112 so that it is suitable for transmission/storage on channel 114. For example, transmitted waveform 112 may correspond to an analog Binary Phase-Shift Keying (BPSK) signal, analog Phase-Shift Keying (PSK) signal, analog Frequency-Shift Keying (FSK) signal, analog Quadrature Amplitude Modulation (QAM) signal, or any other suitable analog or digital signal.

Channel 114 refers to the physical medium through which transmitted waveform 112 may pass before being recovered at demodulator 118. Various characteristics of a channel may corrupt data that is communicated or stored thereon, and as such, the data received over the channel may be different from the original values originally transmitted thereon. Thus, received waveform 116 may not be an exact replica of transmitted waveform 112, but rather may be a corrupted version of the transmitted waveform 112. Received waveform 116 may be demodulated by demodulator 118 to produce soft information 120 using frequency filters, multiplication and integration by periodic functions, and/or any other suitable demodulation technique corresponding to the type of modulation used in modulator 110. Soft information 120 may contain information related to codeword 108, for example, soft information 120 may correspond to a preliminary estimate of codeword 108, a probability distribution vector of possible values of codeword 108, or to more general combinations of these as well other items.

Edge-based LDPC decoder 122 may be used to correct and/or detect errors that occur in codeword 108 due to transmission through channel 114. To do so, edge-based LDPC decoder 122 may decode soft information 120 using parity check matrix 121 to produce message estimate 124. Message estimate 124 will also referred to as m̂, and parity check matrix 121 will also be referred to as H. Edge-based LDPC decoder 122 may use any of a number of possible decoding algorithms to produce message estimate 124. For example, edge-based LDPC decoder 122 may use one of many iterative decoding algorithms known as belief propagation algorithms.

Figure 5:
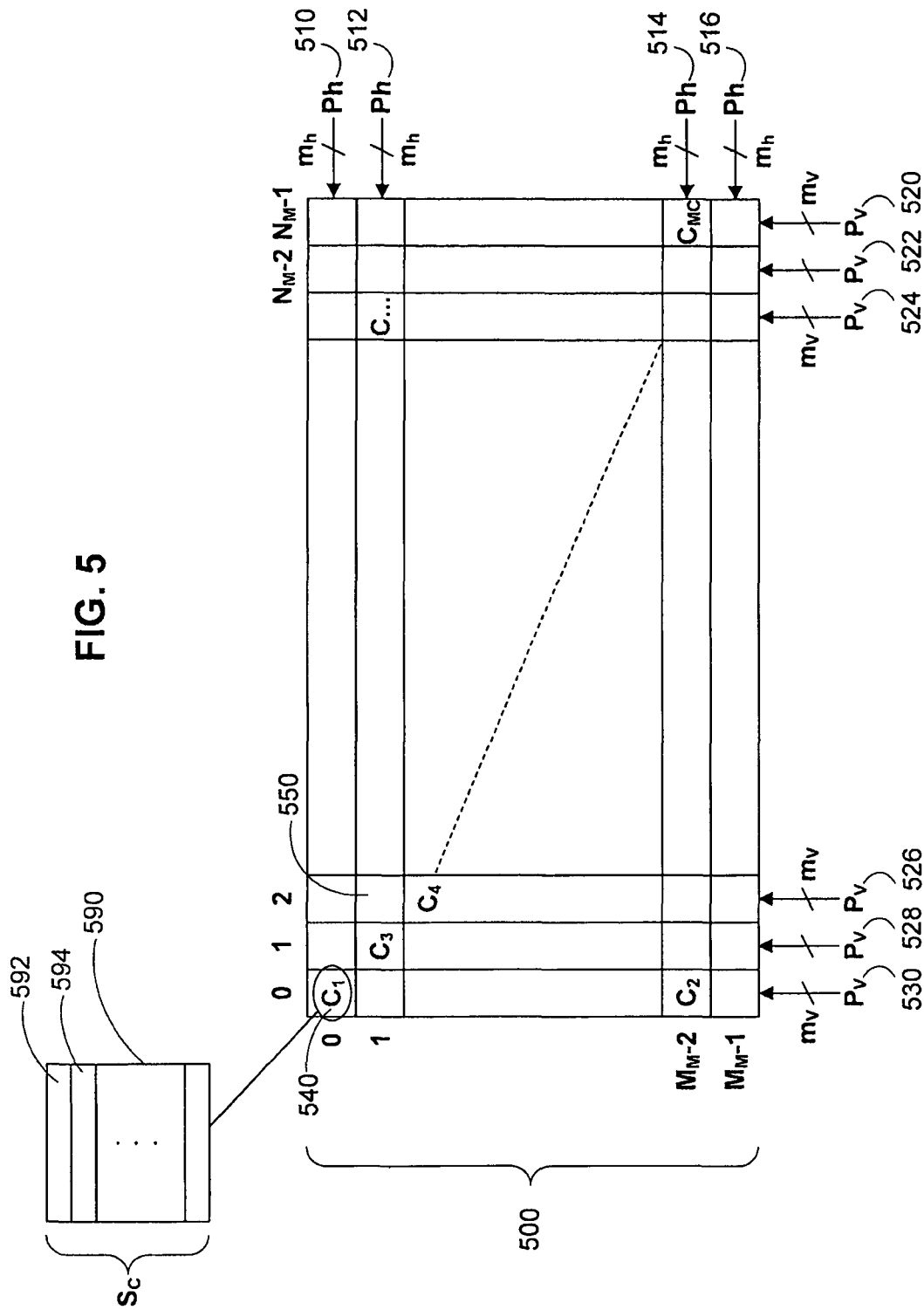
FIG. 5 shows the structure of an illustrative parity check matrix and the processing of the parity check matrix with an edge-based LDPC decoder in accordance with some embodiments.

According to some embodiments, edge-based LDPC decoder 122 may be implemented on parity check matrix 500 as shown in FIG. 5. In some embodiments, such an implementation may be advantageous at least because a special design of parity check matrix 500 may provide an increase in decoding throughput, a reduction of the occurrence of decoding memory conflicts, and an increase in supportable data rates. These advantageous features may be possible due to the specific parity check matrix design and division of edge-based processors into type-A and type-B processors as shown in more detail in FIG. 6 and FIG. 8. Such type-A and type-B processors may operate in different periods of time according to a timing diagram such as the timing diagram of FIG. 7, in order to achieve desirable effects stated above.

Message 124 may be delivered to second user or application 126. If LDPC decoder 122 was able to correctly identify and correct all errors, message estimate 124 will be an exact replica of message Misra 104. Otherwise, message estimate 124 may differ from message 104.

Figure 2:
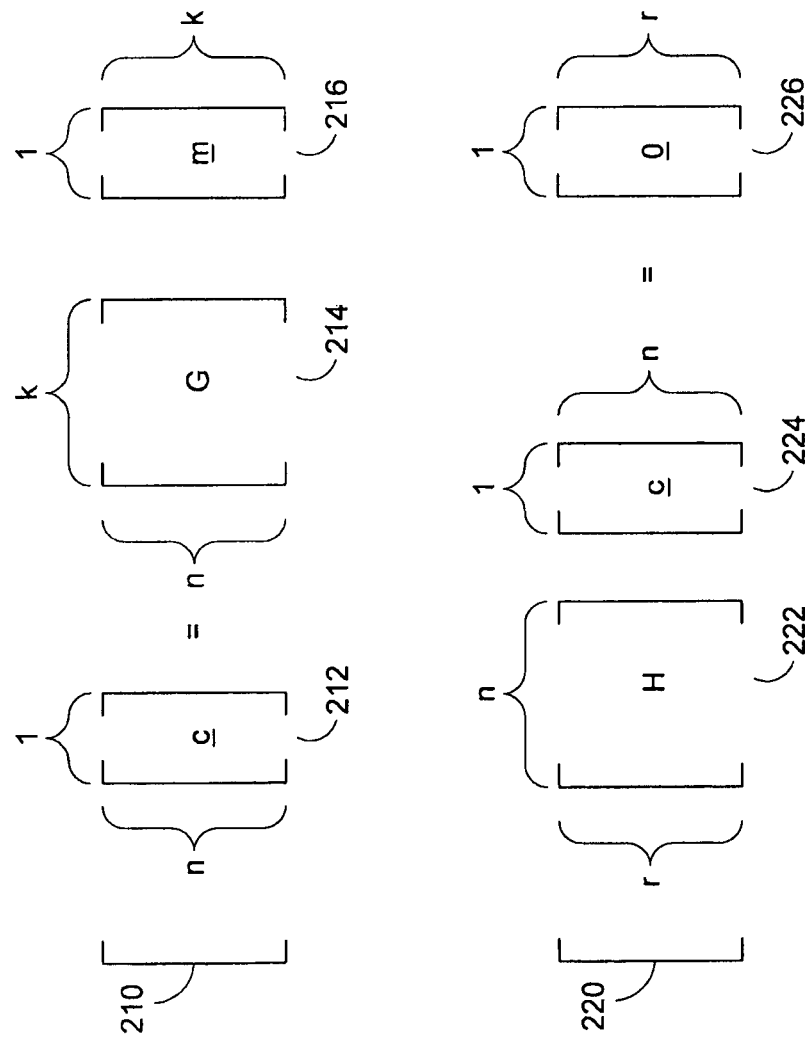
FIG. 2 shows an illustrative example of the construction and properties of a codeword in accordance with some embodiments.

FIG. 2 shows an illustrative example of the construction and properties of codeword 1080 in accordance with some embodiments. Equation 210 depicts the construction of codeword 212 using generator matrix 214 and message 216. Codeword 212 may be constructed by matrix multiplying generator matrix 214 and message 216. Codeword 212 is n data symbols long and may be represented by a vector of size [n×1]. Generator matrix 214 is a matrix of size [n×k] that defines the LDPC code. Message 216 is k symbols long and may be represented by a vector of size [k×1]. As discussed in relation to FIG. 1, codeword 212 may be decoded in edge-based LDPC decoder 122 to produce message estimate 124.

Equation 220 illustrates parity check matrix 222. Parity check matrix 222 is a matrix of size [r×n], where r satisfies the inequality r≧n−k. When parity check matrix 222 is multiplied by codeword 224, the result is zero-vector 226, which is a vector of size [r×1] where all elements equal zero. Parity check matrix 222 is any matrix that produces a null matrix, or a matrix of all zeros, of size [r×k] when multiplied by generator matrix 214. Thus, parity check matrix 222 is not unique, and may be chosen, for example, to be computationally convenient and/or to increase the decoding throughput of edge-based LDPC decoder 122.

Figure 3:
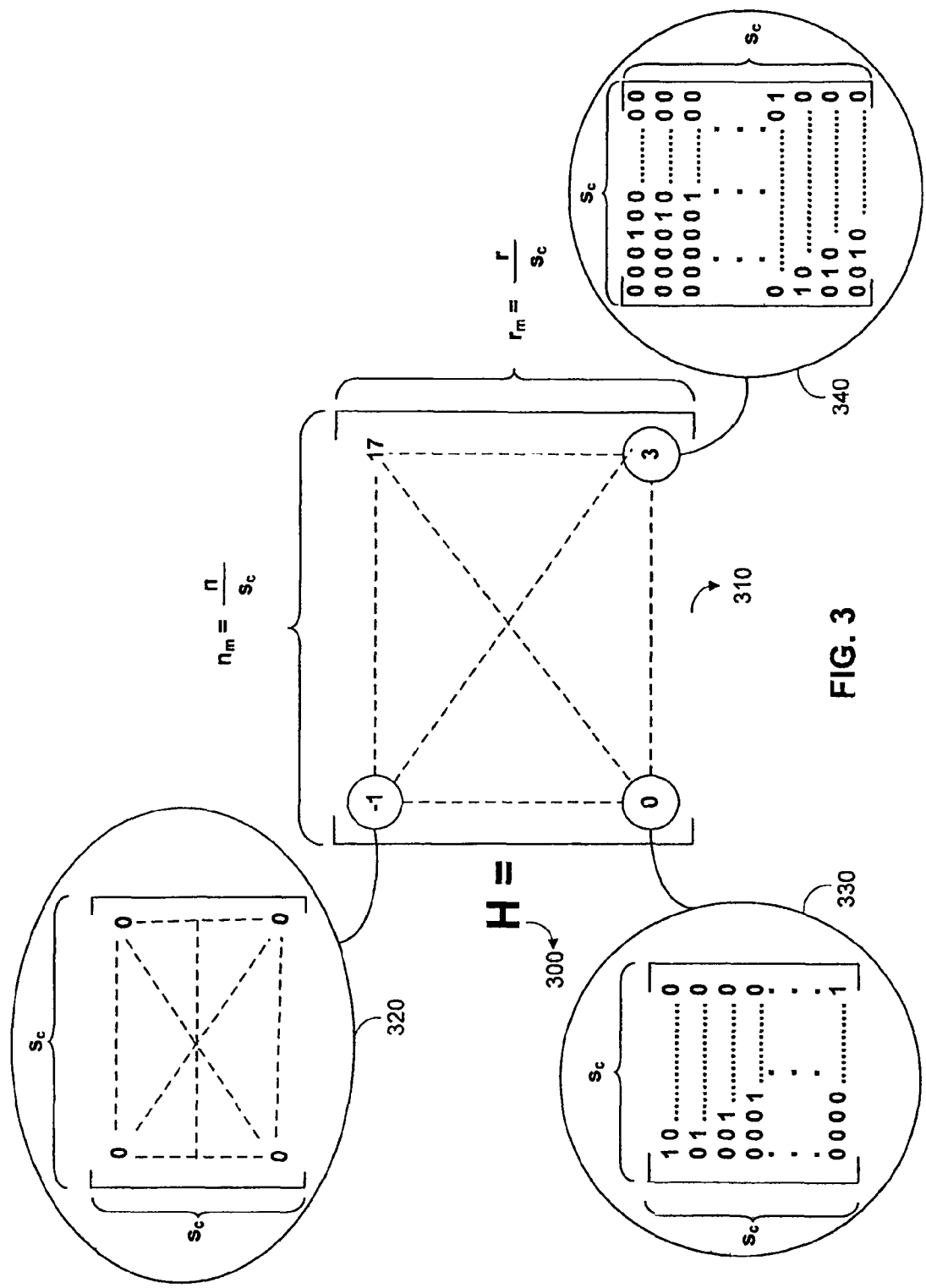
FIG. 3 shows an illustrative example of a parity check matrix in a mother matrix representation in accordance with some embodiments.

FIG. 3 shows an illustrative example of parity check matrix 222 in a mother matrix representation in accordance with some embodiments. Mother matrix 310 is also referred to as a seed matrix. A mother matrix representation is a compact way for describing a matrix that may contain a large number of elements. The mother matrix representation is equivalent to the normal matrix representation, but may be advantageous in illustrating the structure of a possibly large matrix without the necessity of explicitly listing each element in the matrix.

Each of the elements in mother matrix 310 represents a circulant submatrix. For example, submatrix 320, submatrix 330, and submatrix 340 are each circulant submatrices. A circulant submatrix is a square $[S_c \times S_c]$ binary matrix with the property that, for any given positive integer $M < S_c$, if any column is cyclically shifted by M positions, another column of the same circulant submatrix is obtained, and similarly, if any row is cyclically shifted by M positions, another row of the same circulant submatrix is obtained. It may be often beneficial to represent circulants so that they have the property that a cyclic shift by M=1 of any given column (or row) will give the next column (or row) of the same circulant submatrix. The value of each non-negative integer in mother matrix 310 specifies the corresponding circulant submatrix in terms of a "shift" relative to the identity matrix. For example, the number zero represents identity matrix 330 of size $S_c$, and the number three represents identity matrix 330 with each row cyclically shifted to the right by three positions 340. As a matter of notation, minus-one denotes the all-zero matrix 320. For brevity, the phrase "non-zero circulant" will be used to refer any circulant matrix that is not the all-zero matrix. Recall that parity check matrix 300 is of size [r×n]. Thus, the size of mother matrix 310 is $[r_m = r/S_c \times n_m = n/S_c]$, where $S_c$, r, and n are chosen so that $r_m$ and $n_m$ are integers.

Mother matrix 310 may be a quasi-cyclic matrix. A quasi-cyclic matrix consists of circular submatrices (circulants) of the same size. If a quasi-cyclic representation of parity check matrix is used, then implementation of LDPC encoder 106 and edge-based LDPC decoder 122 may be significantly simplified. One reason for this is that parity check matrix 222 may be easier to store, as only the first row of each circulant matrix needs to be stored to generate the entire circulant. Another reason is that the storage of the messages used in LDPC decoders can be made compact and that parallelization in the encoder/decoder is achievable with simple shifting operations, since adjacent rows (or adjacent columns) corresponding to the same circulant are cyclic shifts of each other. In addition, for some quasi-cyclic LDPC codes, encoding and decoding can be further simplified by efficient address-generation.

Mother matrix 310 may also be a sparse matrix. A sparse matrix is a matrix for which the number of non-zero elements is small compared to the number of zero elements. A sparse parity check matrix may allow for larger decoder throughput, as little or no computational resources need be dedicated to manipulating zero elements in mother matrix 310.

Figure 4:
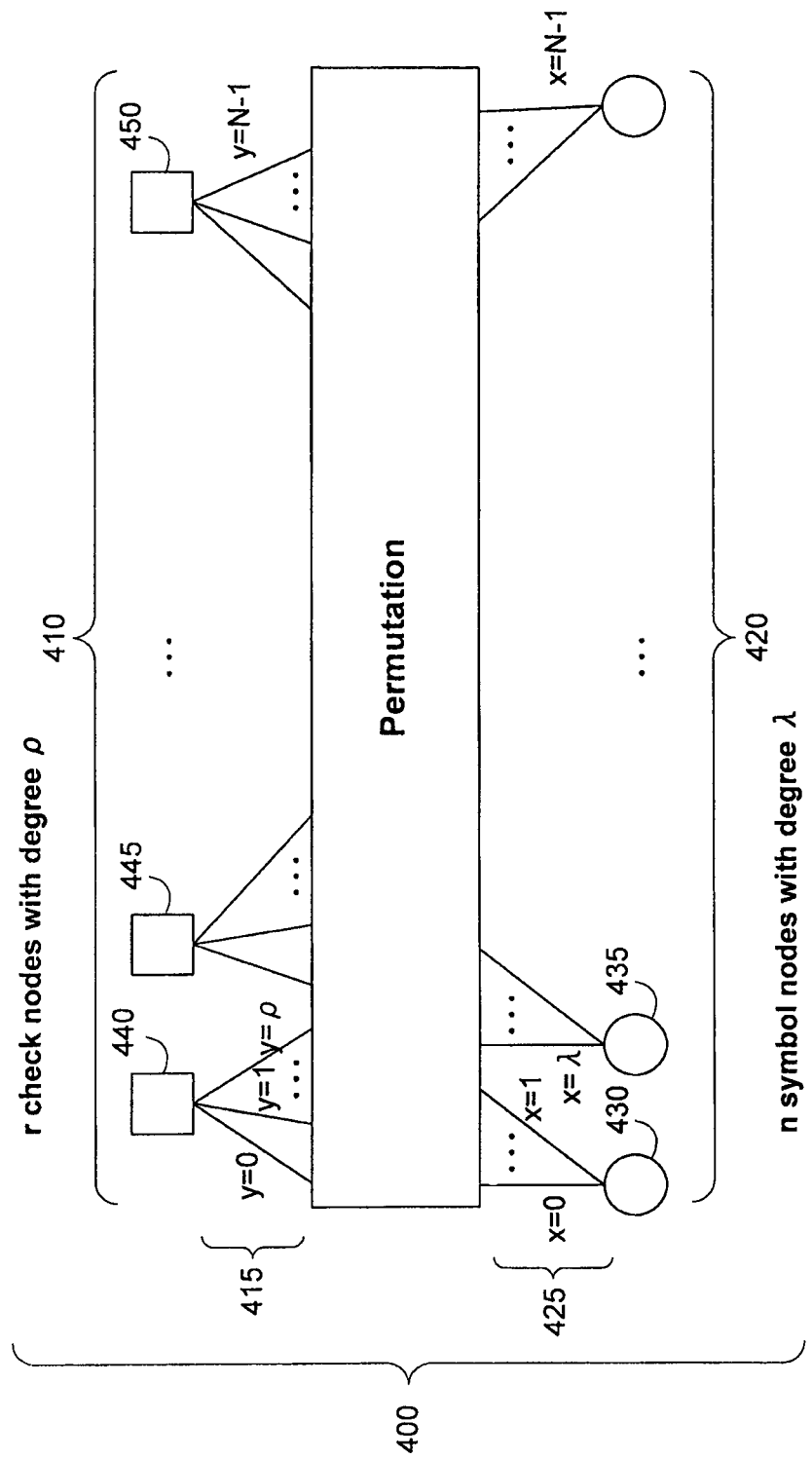
FIG. 4 shows an illustrative representation of a generic LDPC code on a Tanner graph.

FIG. 4 shows an illustrative representation of a generic LDPC code on Tanner graph 400. Tanner graph 400 is also referred to as a bipartite graph.

Tanner graph 400 is a graphical tool that illustrates the operation of edge-based LDPC decoder 122, and specifically, how edge-based LDPC decoder 122 uses parity check matrix 121 and an iterative two-step decoding algorithm to decode soft information 120 and produce message estimate 124.

There are two types of nodes shown in FIG. 4. Symbol nodes 420 represent each position in codeword 1080 and are denoted by circles. Thus, there are n symbol nodes. Symbol nodes 420 are also referred to as bit nodes or variable nodes. Parity check nodes 410 represent syndromes (parity check equations) of parity check matrix 222. For example, there may be n-k parity check nodes. Parity check nodes are denoted by squares.

In this representation, symbol nodes 420 may correspond to columns of parity check matrix 222 and parity check nodes 410 may correspond to rows of parity check matrix 222. A line is drawn connecting a given symbol node to a given parity check node if and only if a "1" is present in the corresponding entry in parity check matrix 222. For example, if the entry in the second row and third column of parity check matrix 222 is a "1", then a line is drawn connecting the second parity check node to the third symbol node. Therefore, if there are λ "1"s in a given column of parity check matrix 222, then there are λ edges emanating from the symbol node corresponding to that column. Similarly, if there are ρ "1"s in some given row of parity check matrix 222, then there are ρ edges emanating from the parity check node corresponding to that row. Tanner graph 400 is referred to a regular code graph if each symbol node has the same degree λ and if each parity check node has the same degree ρ. LDPC codes with such property are called regular LDPC codes; otherwise the codes are called irregular.

Irregular LDPC codes will be discussed shortly.

LDPC codes are often decoded via iterative two-step decoding algorithms which may also be known as belief propagation or message-passing algorithms. Such decoding algorithms perform several rounds (or iterations) of message updates according to the structure of Tanner graph 400 and the chosen decoding algorithm in order to decode soft information 120 and produce message estimate 124. Such algorithms may use edges 415 and 425 as the basis for passing messages between parity check nodes 410 and symbol nodes 420. Furthermore, such algorithms may evaluate the number of parity check failures present in a processed version of soft information 120 at the end of each iteration, e.g., by computing a syndrome corresponding to the processed version of soft information 120.

Each round may consist of two steps. In the first step, each of the symbol nodes 420 sends its current message to each parity check node to which it is connected. The parity check nodes then perform computations based on the message that they receive. In the second step, each of the parity check nodes 425 sends its current message to each symbol node to which it is connected. Each symbol node then performs computations based on the message that it receives. This process is repeated until either the codeword has been decoded or until a threshold number of rounds has been reached. The message that is sent during each step of each round depends on the particular decoding algorithm in use. The message may correspond to log-likelihood ratio values, probabilities, hard decisions, or any other suitable type of data that is compatible with the decoding algorithm.

The edge-based decoding on parity check matrix 500 can be applied to regular or irregular LDPC codes. To illustrate the decoding operation on Tanner graph 400 for irregular LDPC codes, denote the node degree profile in Tanner graph 400 using the polynomials $$\mu(x) = \sum_{i=1}^{L} \mu_i x^{i-1} \text{ and } \beta(x) = \sum_{i=1}^{R} \beta_i x^{i-1}.$$

In this notation $\mu_i$ denotes the number of degree-i symbol nodes 420 in parity check matrix 222. Similarly, $\beta_i$ denotes the number of degree-i parity check nodes 410 in parity check matrix 222. The maximum symbol and parity check node degrees are denoted by L and R, respectively. Therefore, the code rate is given by $$R_C \geq 1 - \frac{\sum_{i=1}^{L} i \times \mu_i}{\sum_{j=1}^{R} j \times \beta_j}.$$

The node degree profiles $\mu(x)$ and $\beta(x)$ are useful at least because they can be used to calculate a noise variance threshold, i.e., minimum SNR, with the following important property. For any noise variance less than or equal to the threshold, edge-based LDPC decoder's 122 bit-error rate can be made as small as desired by making the encoded block length n adequately large (for example, see "The Capacity of Low-Density Parity-Check Codes under Message-Passing Decoding," *IEEE Transactions on Information Theory*, February, 2001) In practice, this SNR threshold may be a very good indicator of the code performance even when n is not very large. For example, this threshold may provide a good indication of code performance across a wide range of SNR values in the waterfall region, i.e., the region over which the decoding bit-error probability decreases rapidly as SNR is increased.

FIG. 5 shows the structure of an illustrative parity check matrix and processing of the parity check matrix with an edge-based LDPC decoder in accordance with some embodiments. Decoder of parity check matrix 500 may be implemented in a field programmable gate array (FPGA), an application-specific integrated circuit (ASIC), or in any other suitable hardware- or software-based configuration. Decoder on parity check matrix 500 may be used in an embodiment of edge-based LDPC decoder 122. Edge-based LDPC decoder may include memory locations and processors. The memory locations may store messages associated with the decoding algorithm, and the processors may be used to read and write messages to and from memory locations. The organization of the memory locations may be governed by a parity check matrix, e.g., parity check matrix 300, and the operation of the processors may be governed by a two-step iterative decoding algorithm, as described in relation to FIG. 4.

Each square in parity check matrix 500, for example, square 540 or square 550, may represent a circulant matrix of size $[S_c \times S_c]$. If a square represents a circulant matrix having at least one non-zero entry, that square is given a label $C_k$, where k is a non-negative integer. Otherwise, the square is not labeled. Let $M_c$ denote the number of labeled squares, i.e., $M_c$ is the number of non-zero circulants in parity check matrix 500. Squares are labeled starting with k=1, so that the labeled squares in parity check matrix 500 are $C_1, C_2, \ldots, C_{M_c}$. Edge messages (e.g., LLR messages) corresponding to each square are stored in one memory block. That is, all edge messages corresponding to one square (one circulant) are assigned to one memory block. Hence, if there are $M_c$ non-zero circulants, there are $M_c$ memory blocks in the decoder. As an illustrative example, suppose that in graph 400, there is an edge connecting symbol node 430 to parity check node 440. And suppose that there is an edge connecting symbol node 435 to parity check node 445. Also suppose that these two edges belong to the same circulant (e.g. circulant $C_1$). During the iterative decoding algorithm, the messages passed (in either direction) along the edge connecting symbol node 430 to check node 440 could, at each step in the algorithm, be stored in memory location 592. During the iterative decoding algorithm, the messages passed along the edge connecting symbol node 435 to check node 445 could, at each step in the algorithm, be stored in memory location 594. Note that the memory locations 592 and 594 are in the same memory block 590 and that the memory block 590 corresponds to circulant $C_1$.

Decoder on parity check matrix 500 may include processors that are used to read from and write to the particular memory locations of the decoder for parity check matrix 500. Edge-based LDPC decoder may include two types of processor banks, check node processor banks and variable node process banks. A single check node processor bank 510, 512, 514, or 516 may be used to read from and write to memory locations corresponding to circulant-rows of parity check matrix 500, and a single variable node processor bank 520, 522, 524, 526, 528, or 530, may be used to read from and write to memory locations corresponding to circulant-columns of parity check matrix 500. Note that, for example, a circulant-row refers to one row in parity check matrix 500 (where each element of a row is a circulant matrix, as discussed above in relation to FIG. 3). Each processor bank may be comprised of one or more processors. Let $m_h$ denote the number of processors per check node processor bank (per circulant-row), and $m_v$ denote the number of processors per variable node processor bank (per circulant-column). Hence, in FIG. 5, there are $M_m \times m_h$ horizontal processors and $N_M \times m_v$ vertical processors. All $M_M \times m_h$ horizontal processors may work in parallel (simultaneously) to process a portion (set of edges) of each circulant in one time period. In the next time period, the same processors may be used to process next set of (unprocessed) edges of each circulants. Similarly, all $N_M \times m_v$ vertical processors may work in parallel (simultaneously) and process a portion (set of edges) of each circulant in one time period. In the next period, the same processors may be used to process next set of (unprocessed) edges of each circulants. The term "processor" may itself refer to an actual physical processing device, to multiple such devices, or to a fractional of usage of such a device. For example, the term processor could refer to multiple physical processing devices that are coordinated to act as a single processor or to a single, powerful physical processing device that divides its resources over time so as to appear as any particular processor only for a certain fraction of time.

As explained above in relation to FIG. 4, the decoding operation may run in several rounds (or iterations), and each round may consist of two steps. During the first step, the value stored in a given memory location corresponding to a given edge is the message sent from the check node to the variable node connected to that edge. Thus, during this step, a message may be written to the memory location in the decoder for parity check matrix 500 using one or more horizontal processors from the processing bank assigned to that memory location. During the second step, the value stored in a given memory location corresponding to a given edge is the message sent from the variable node to the check node connected to that edge. Thus, during this step, a message may be written to the memory location in the decoder of the parity check matrix 500 using one or more vertical processors from the processing bank assigned to that memory location. The decoding process may perform $N_{it}$ iterations to decode soft information 120 and produce message estimate 124 (the subscript 'it' is an abbreviation for "iteration").

In the discussion above, the content of each message written to or read from each memory location may, in general, depend on the particular decoding algorithm employed by edge-based LDPC decoder 122. However, the overall operation of decoding on parity check matrix 500, as described above, does not depend on the specific choice of the decoding algorithm. The methodology described above applies to many iterative decoding algorithms, including the sum-product and the min-sum decoding algorithms.

Figure 6:
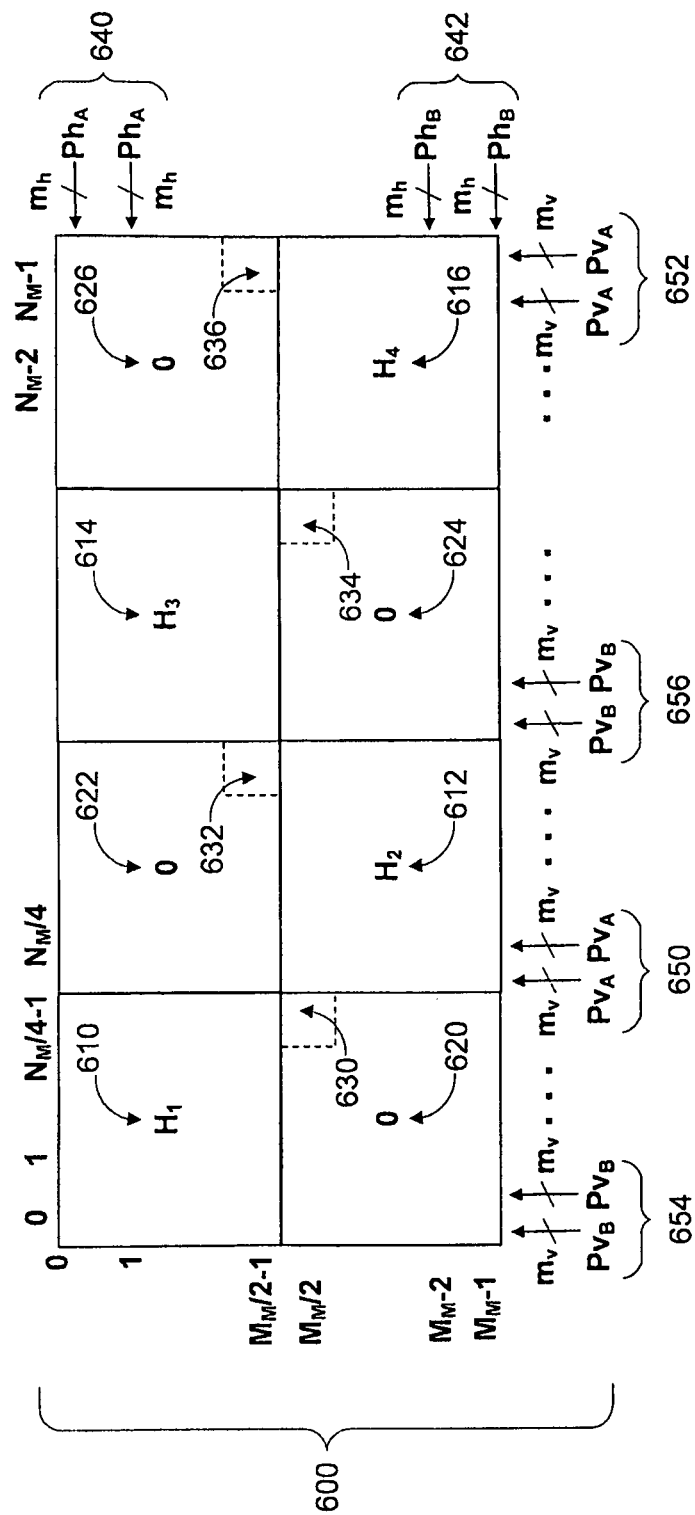
FIG. 6 shows the structure of an illustrative checker-board parity check matrix and the processing of the parity check matrix with a modified edge-based LDPC decoder.

FIG. 6 shows the structure of an illustrative checker-board parity check matrix and processing the parity check matrix with a modified edge-based LDPC decoder (usage of the term "checker-board" to describe parity check matrix 600 will be explained below). Parity check matrix 600 is a further illustration of parity check matrix 500 and may be used in an embodiment of edge-based LDPC decoder 122. As explained below, decoding on parity check matrix 600 may be comprised of memory locations and processors. The memory locations may store messages associated with an iterative decoding algorithm, and the processors may be used to read, process, and write messages to and from memory locations.

Parity check matrix 600 may contain matrix sub-blocks 610, 612, 614, 616 and zero sub-blocks 620, 622, 624, 626. Matrix sub-blocks 610, 612, 614, and 616 are labeled 'H1', 'H2', 'H3', and 'H4', respectively. Each sub-block may be comprised of one or more circulant submatrices, some of which can be all-zero matrices. For each non-zero circulant submatrix there is an associated memory block assigned to it in the decoder, as described above. Each of those memory blocks contains memory locations that correspond to edge-messages in Tanner graph 400, as described above. These messages may be updated twice per round (or iteration) of the decoding algorithm. The message stored in each such memory location may represent, for example, the LLR of a (particular) symbol value, the probability of a symbol value begin equal to a certain number, the current estimate of a symbol value, or any other suitable message.

All-zero blocks 620, 622, 624, 626 are labeled '0' in FIG. 6. "Checker-board" parity check matrices also contain regions with small set of contiguous non-zero circulants. These regions are denoted by dotted squares in FIG. 6, and are referred to as type-C circulants 630, 632, 634, 636. Type-C circulants 630, 632, 634, 636 are also referred to as connector circulants. Type-C circulants 630, 632, 634, 636 are important at least because they facilitate in maintaining good BER/SER performance and, in one embodiment, the memory locations contained within type-C circulants 630, 632, 634, 636 may be processed during dedicated decoding time, in which no other type of data is processed.

Decoder of parity check matrix 600 may include processors that are used to read from and write to the particular memory locations of the decoder of parity check matrix 600. A single horizontal processor bank 640, 642 may be used to read from and write to memory locations in memory blocks corresponding to a particular circulant-row of parity check matrix 600, and a single vertical processor bank 650, 652, 654, 656 may be used to read from and write to memory locations in memory blocks corresponding to a particular circulant-column of parity check matrix 600, wherein each horizontal processor bank 640, 642 may be comprised of $m_h$ processors, and each vertical processor bank 650, 652, 654, 656 may be comprised of $m_v$ processors. Further, each horizontal processor bank may be assigned either as a type-A horizontal processor bank 640, used to process the memory locations in memory blocks corresponding to the first sub-block-row (one subblock-row of a matrix in FIG. 6 may contain one or many circulant-rows), or as a type-B horizontal processor bank 642, used to process the memory locations in memory blocks corresponding to the second subblock-row. Similarly, each vertical processor bank may be assigned as a type-A vertical processor bank 650, 652, used to process the memory locations in memory blocks corresponding to the second and fourth subblock-columns (one subblock-column of a matrix in FIG. 6 may contain one or many circulant-columns), respectively, or as a type-B vertical processor bank 654, 656, used to process the memory locations in memory blocks corresponding to the first and third subblock-columns, respectively. The distinction between type-A and type-B processors can be physical (in which case each processor may be assigned for sole use as a type-A or type-B processor), purely logical (in which case the same processor and related hardware may be used as both a type-A and type-B processor during different instants of time), or some combination of physical and logical.

The term checker-board will be used to refer LDPC parity check matrices (e.g., parity check matrix 600) which contain an alternating pattern of matrix sub-blocks (e.g., matrix sub-blocks 610, 612, 614, and 616) and zero sub-blocks (e.g., zero sub-blocks 620, 622, 624, and 626) arranged so that both horizontal processing banks (e.g., horizontal processing banks 640 and 642) and vertical processing banks (e.g., vertical processing banks 650, 652, 654, and 656) may be used to access memory locations simultaneously and without causing significant memory access conflicts. Parity check matrix 600 and parity check matrix 800 (FIG. 8) are illustrative examples of checker-board parity check matrices.

The design of checker-board parity check matrices 600 is useful at least because it allows horizontal processor banks 640, 642 and vertical processor banks 650, 652, 654, 656 to access memory locations in decoder of parity check matrix 600 simultaneously (i.e., during the same time in a given decoding iteration) without causing memory access conflicts. A memory access conflict may occur when, for example, a horizontal processor (e.g., one of the processors from horizontal processor banks 640, 642) and a vertical processor (e.g., one of the processors from vertical processor banks 650, 652, 654, 656) attempt to access the same or different memory locations within a single memory block during the same step of a given decoding iteration. For example, a memory access conflict could occur if a horizontal processor and a vertical processor attempt to access the same or different locations in a memory block which corresponds to a part of (or to entire) matrix sub-block 612 during the same time in a given decoding iteration.

It may be possible to avoid memory access conflicts, including the type described above, by designing a decoding architecture for which, at one time in each decoding iteration, only horizontal processors or only vertical processor may be used. For example, one such design could alternatively use only horizontal and only vertical processors at one time each decoding iteration. However, at least one drawback to this approach is that decoding throughput may be lowered, as on average, each vertical and horizontal processor bank would be idle for at least one half of the available decoding time. Therefore, in this case, decoding throughput may only be approximately one half of the decoding throughput in an alternate design for which both horizontal processing banks 640, 642 and vertical processing banks 650, 652, 654, 656 are operational at all times (or almost all times) in all decoding iterations.

In decoder of the parity check matrix 600, both horizontal and vertical processing banks may be operational at all times (or almost all times) in all decoding iterations while still avoiding memory conflicts of the type described above. This desirable characteristic may be possible due to the checker-board design of LDPC parity check matrix and design of edge-based decoder 600 and the division of processors into type-A processors and type-B processors. In decoding the parity check matrix 600, in a given time period of a given decoding iteration, only type-A processors or type-B processors may be used, and the use of type-A and type-B processors may alternate from one time period to the next time period (an illustrative processor timing diagram of decoding the parity check matrix 600 will be shown in FIG. 7). As one example, parity check matrix 600 may be designed so that in the first time period of each decoding iteration, type-A processors (both vertical and horizontal) may be run simultaneously, and in the second time period of each decoding iteration, type-B processors (both vertical and horizontal) may be run simultaneously.

Consider a decoding time period in which only type-A processors are run. The design of the checker-board parity check matrix guarantees that the memory location or locations requested by any type-A vertical processor will correspond to a different matrix sub-block than the memory location or locations requested by any type-A horizontal processor (since valid matrix sub-blocks do not include zero circulants). Type-C circulants may not be processed using type-A and type-B processors, as was described above. Instead, a different type of processing of type-C circulants may be used (one type of suitable processing will be described later). Therefore, memory conflicts are avoided (except for possibly in a small portion of the parity check matrix, containing type-C circulants), while allowing, for example, $m_v$ type-A vertical processors per circulant-column and $m_h$ type-A horizontal processors per circulant-row to run in the same decoding time period. Since both vertical and horizontal (type-A) processors are able to run in each step of each decoding iteration, decoding throughput may be increased relative to a design in which certain processors are used only during certain decoding steps.

It will be clear to one skilled in the art that many configurations of parity check matrix 600 can be varied. For example, all-zero blocks having structures other those described above can be used, and the location of type-C circulants and the values of the circulant matrices outside of the type-C region can also be varied. It will be clear to one skilled in the art that any number of horizontal and vertical processor can be used in each processing bank, and that type-A and type-B processors of a fixed type (horizontal or vertical) may have the same specifications (for example, throughput, response time, and/or interface) or they may have different specifications. Also, the checker-board parity check matrix 600 could be modified to have more than two types of horizontal and/or vertical processor banks.

Figure 7:
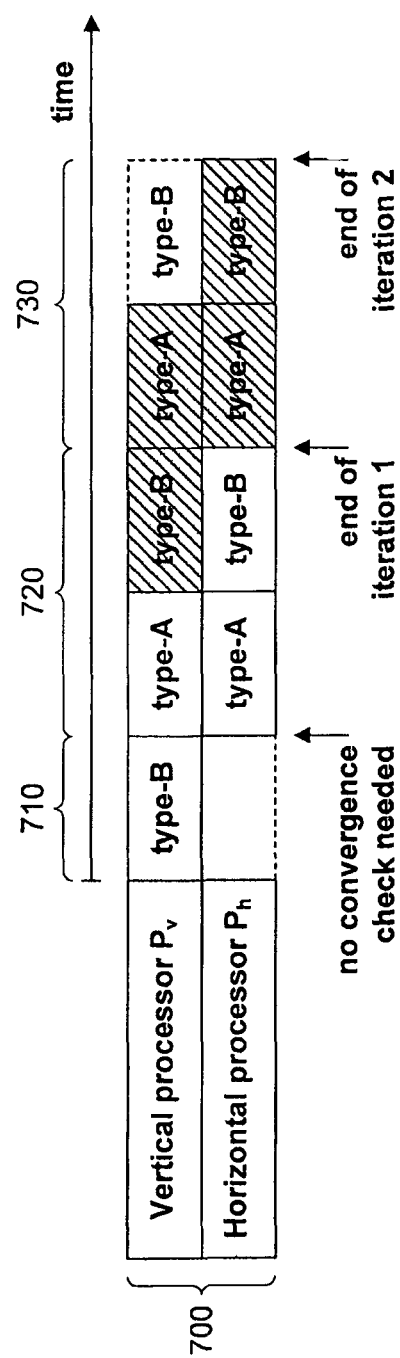
FIG. 7 shows an illustrative example of a processor timing diagram corresponding to a parity check matrix implemented in a edge-based LDPC decoder in accordance with some embodiments.

FIG. 7 shows an illustrative example of a processor timing diagram corresponding to decoding of the parity check matrix 600 implemented in edge-based LDPC decoder 122 in accordance with some embodiments. Timing diagram 700 depicts the utilization of type-A and type-B horizontal and vertical processor banks during an initialization phase and the first two rounds (or iterations) of the iterative decoding process. In time period 720, the first round of the iterative decoding algorithm is performed and in time period 730, the second round of the iterative decoding algorithm is performed. Each iteration may consist of two decoding or update steps, and the checkerboard design of parity check matrix 600 may enable the simultaneous processing of messages sent from symbol nodes 420 to parity check nodes 410 and messages sent from parity check nodes 410 to symbol nodes 420 during each step.

As shown in timing diagram 700, both vertical and horizontal processing operations are used in each time period of each decoding iteration. Specifically, in the first time period of each iteration type-A horizontal and vertical processors are used, and in the second time period of each iteration type-B horizontal and vertical processors are used (except for the one-time initialization step 710).

Thus, horizontal processors and vertical processors are both active during every time period of every decoding iteration (except for the possibly the first initialization step). Thus, decoding throughput is increased compared to a scheme in which only a vertical processor or a horizontal processor (but not both) is active in each time period of a given decoding iteration. The increase in decoding throughput is a result, at least in part, of separating processors into type-A and type-B processors and of the checker-board design of LDPC parity check matrix 600. Note that a similar timing diagram would describe the LDPC decoding structure even if more matrix sub-blocks were included in parity check matrix 600. This is illustrated in FIG. 8.

Figure 8:
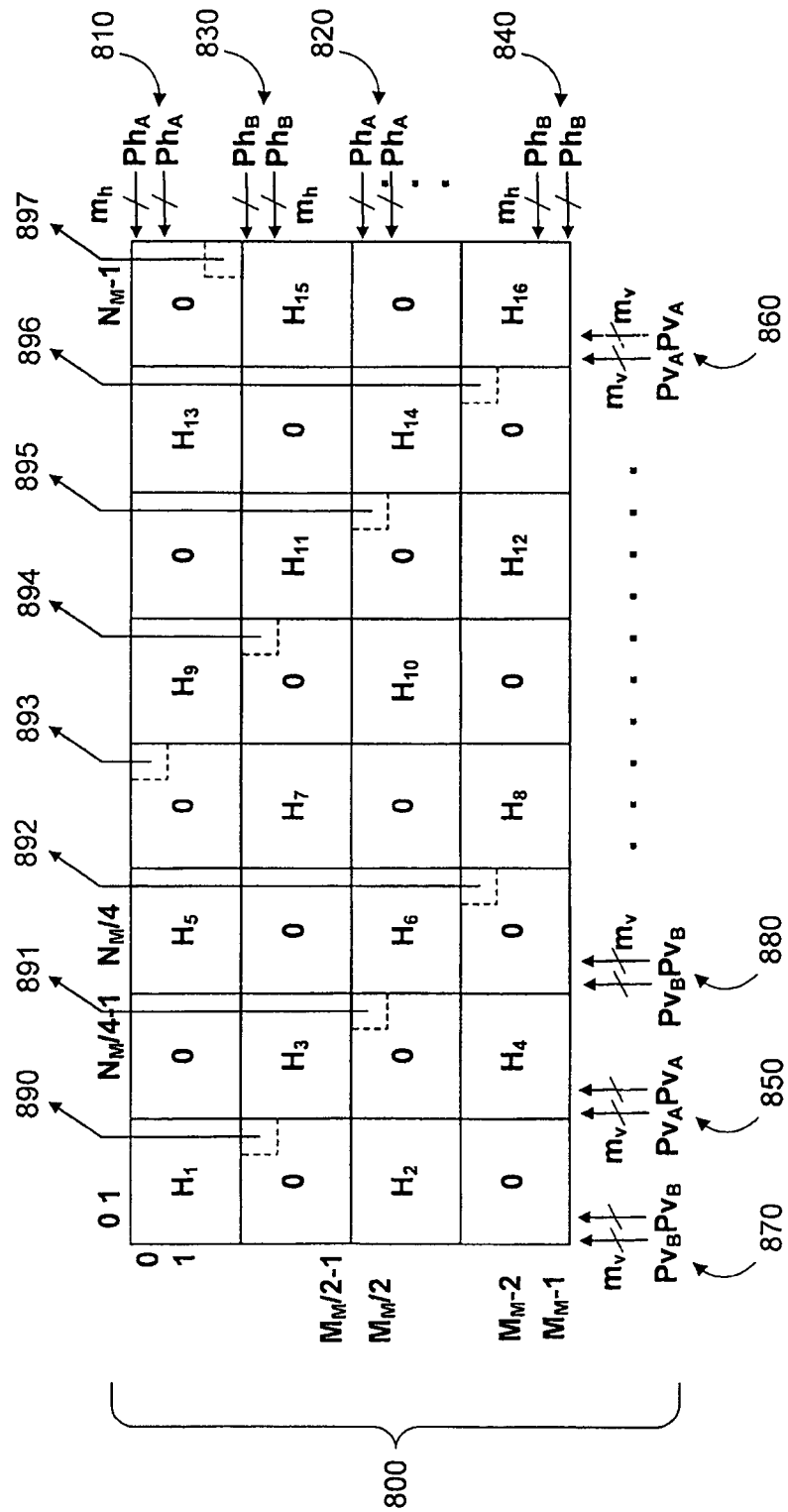
FIG. 8 shows the structure of an illustrative checker-board parity check matrix and processing of a parity check matrix with a modified edge-based LDPC decoder.

FIG. 8 shows the structure of an illustrative checker-board parity check matrix and processing of such matrices with a modified edge-based LDPC decoder. Parity check matrix 800 is a further illustration of parity check matrix 500 and may be used in an embodiment of edge-based LDPC decoder 122.

Compared to parity check matrix 600, parity check matrix 800 contains a larger number of matrix sub-blocks. To see this, note that the division parameter in parity check matrix 600 is D=2 and that in parity check matrix 800 it is D=4 (the division parameter may be interpreted as the number of sub-block rows per row of the mother matrix). Any positive integer number of sub-block rows and sub-block columns can be used in various embodiments of parity check matrix 500. For example, in FIG. 6 parity check matrix 600 has two sub-block rows and four sub-block columns, and in FIG. 8, parity check matrix 800 has four sub-block rows and eight sub-block columns. In other embodiments of parity check matrix 500, the number of sub-block rows may be chosen to be, for example, two, four, eight or any other number, and the number of sub-block columns may be chosen, independently of the number of sub-block rows, to be, for example, six, eight, twelve, eighteen, or any other number. The number of sub-block rows and/or sub-block columns may be chosen to be odd numbers, although choosing one or both of the number of sub-block rows and the number of sub-block columns to be even numbers may provide a more efficient utilization of processors. In parity check matrix 800, type-C circulants 890, 891, 892, 893, 894, 895, 896, and 897 are also present. It will be obvious to one skilled in the art that decoder of the parity check matrix 800 can operate according to timing diagram 700, and that the ability to avoid memory access conflicts attributed to parity check matrix 600 apply to parity check matrix 800 as well.

Figure 9:
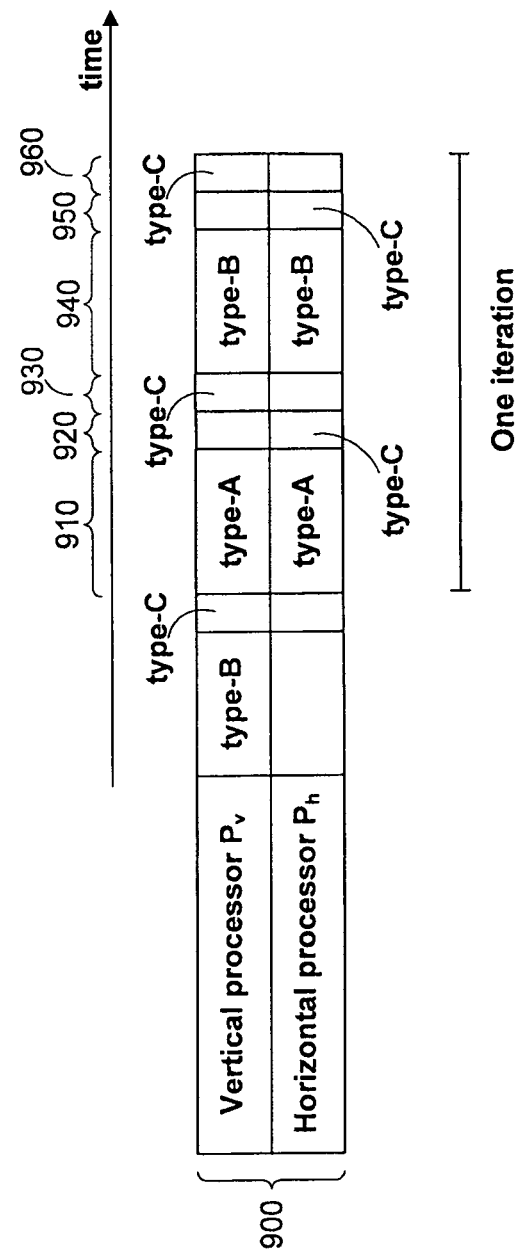
FIG. 9 shows an illustrative example of a processor timing diagram that may correspond to a parity check matrix in accordance with some embodiments.

FIG. 9 shows an illustrative example of a processor timing diagram that may correspond to parity check matrix 600 or 800, in accordance with some embodiments. Timing diagram 900 is similar to timing diagram 700 but depicts one possible technique for processing type-C circulants (connector circulants) during one full iteration of a decoding process which comprises time periods 910, 920, 930, 940, 950, and 960.

In time period 910 type-A horizontal and vertical processors may both be active, as described in relation to FIG. 7. In time periods 920 and 930, type-C circulants may be processed at separate time periods. For example, in time period 920, type-C circulants (connector circulants) may be processed in the horizontal step while no vertical processing is done on the same circulant-column. Similarly, during the time period 930, type-C circulants may be processed in the vertical step, while no horizontal processing is done on the same circulant-row. Given that the sizes of type-C circulants are relatively small, the dedicated time intervals in which type-C circulants are processed (i.e., the duration of time periods 920 and 930) may be small relative to the overall time period needed to process the rest of the checker-board matrix in time period 910.

The iteration may continue in time period 940, where type-B horizontal and vertical processors may both be active. In time period 950, type-C circulants (connector circulants) may be processed in the horizontal step while no vertical processing is done on the same circulant-column, and during the time period 960, type-C circulants may be processed in the vertical step, while no horizontal processing is done on the same circulant-row.

Figure 10A:
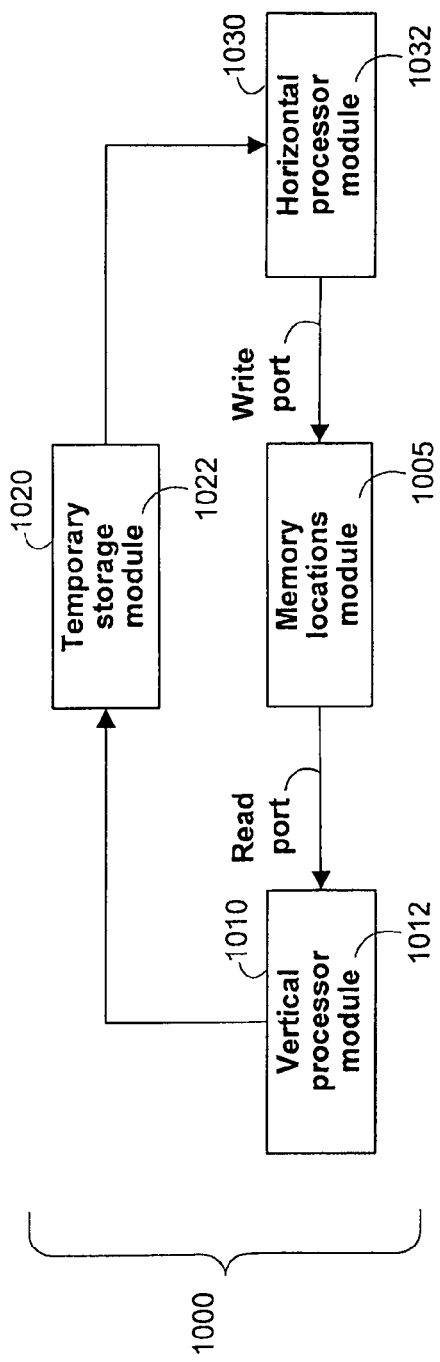
FIG. 10A shows a flow chart for processing type-C circulants using vertical and horizontal processors and a storage module in accordance with some embodiments.

FIG. 10A shows a flow chart for processing type-C circulants using vertical and horizontal processors and a storage module in accordance with some embodiments. Process 1000 may permit horizontal and vertical processors to concurrently process messages within the same circulant without causing memory access conflicts. In process 1000, memory locations module 1005 may store a set of messages that are to be processed by the iterative decoding algorithm. For example, memory locations module 1005 may store the messages corresponding to a single circulant in a suitable parity check matrix. At step 1010, vertical processor module 1012 may read and processes the messages contained in at least one memory location contained in memory locations module 1005. At step 1020, vertical processor module 1012 may store the processed information in temporary storage module 1022. Temporary storage module 1022 may contain a relatively small amount of memory. For example, temporary storage module 1022 may contain significantly less memory than memory locations module 1055 so as to reduce the design cost and/or the physical space of a device employing process 1000. At step 1030, horizontal processor module 1032 may process information previously stored by vertical processor module 1010 by reading the updated information directly from temporary storage module 1022 (for example, instead of reading this information directly from memory storage module 1005), processing the read information, and writing the processed read information to memory locations module 1005. In this way, memory access conflicts caused by the simultaneous use of horizontal and vertical processors may be eliminated in an edge-based LDPC decoder such as decoder on parity check matrix 600 or decoder on parity check matrix 800.

Figure 10B:
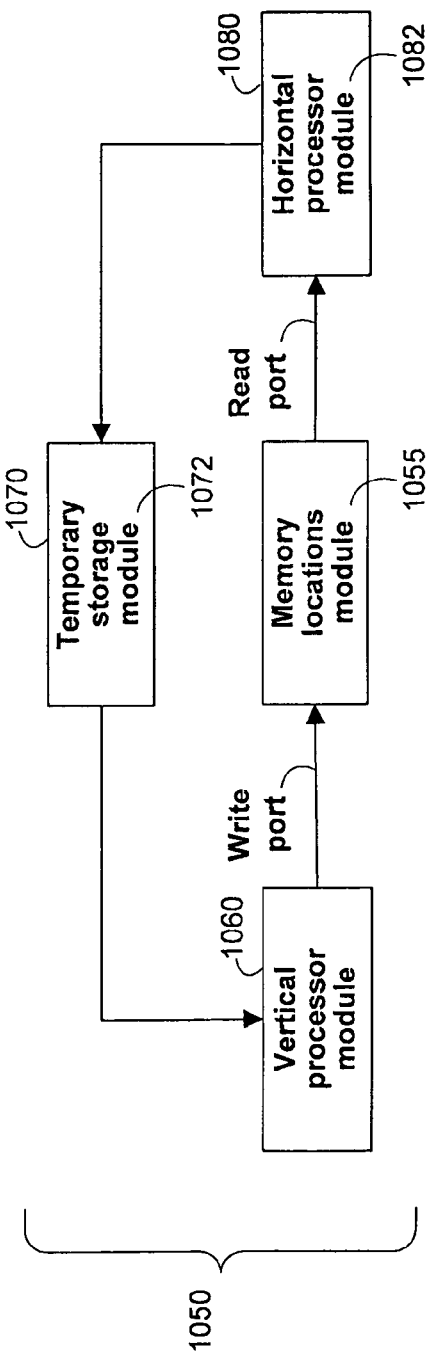
FIG. 10B shows another flow chart for processing type-C circulants using vertical and horizontal processors and a storage module in accordance with some embodiments.

FIG. 10B shows a another flow chart for processing type-C circulants using vertical and horizontal processors and a storage module in accordance with some embodiments. Process 1050 is similar to process 1000, but shows an embodiment in which the horizontal processor module 1080 first accesses memory locations module 1055, followed by vertical processor module 1060. In process 1050, memory locations module 1055 may store a set of messages that are to be processed by the iterative decoding algorithm. At step 108, vertical processor module 1082 may read and processes the messages contained in at least one memory location contained in memory locations module 1055. At step 1070, vertical processor module 1082 may store the processed information in temporary storage module 1072. Temporary storage module 1072 may contain a relatively small amount of memory. At step 1060, horizontal processor module 1062 may process information previously stored by vertical processor module 1082 by reading the updated information directly from temporary storage module 1072, processing the read information, and writing the processed read information to memory locations module 1055. In this way, memory access conflicts caused by the simultaneous use of horizontal and vertical processors may be eliminated in an edge-based LDPC decoder such as decoder of the parity check matrix 600 or decoder of the parity check matrix 800. As illustrated in FIGS. 10A and 10B, the reduction in decoding throughput due to processing of type-C circulants may be made small since the horizontal processor module 1082 or 1032 and vertical processor module 1060 or 1010 can operate simultaneously for a large fraction of the decoding time.

Figure 11:
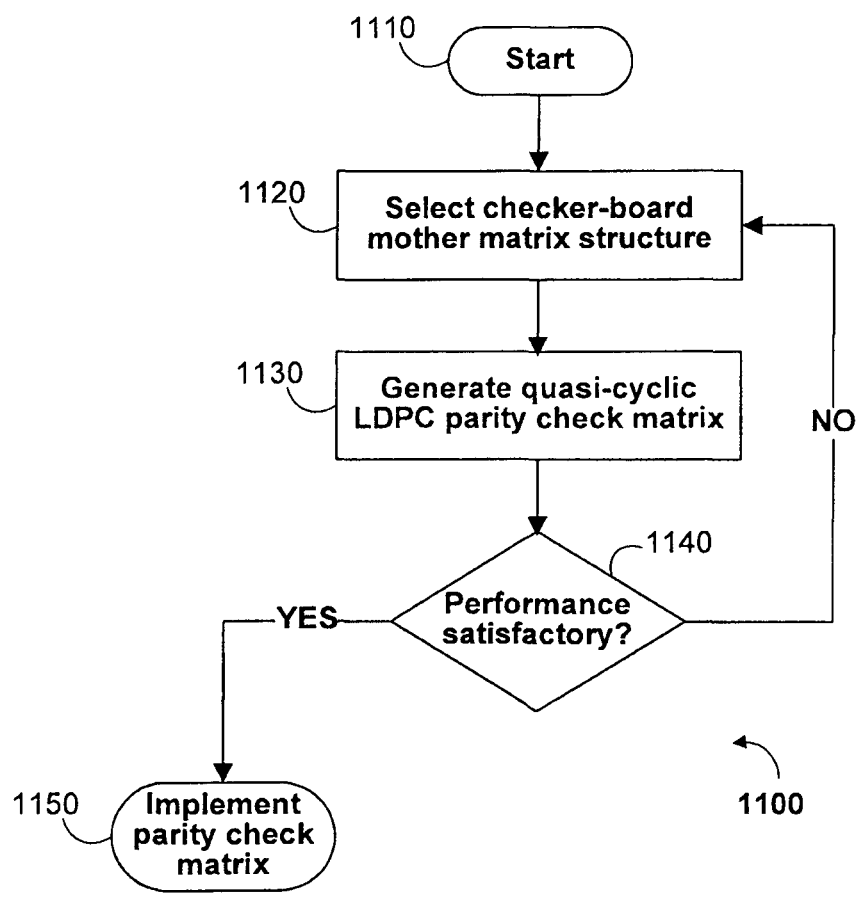
FIG. 11 shows a flow chart of an illustrative process for designing and implementing a LDPC parity check matrix according to the structures described in FIGS. 6-8 and in accordance with some embodiments.

FIG. 11 shows a flow chart of an illustrative process for designing and implementing LDPC parity check matrix 121 according to the structures described in FIGS. 6-8, and in accordance with some embodiments. Process 1100 may begin at step 1110.

At step 1120, a suitable checker-board mother matrix structure for hardware implementation may be chosen. For example, a mother matrix structure similar or identical to that shown in FIG. 6 or FIG. 8 may be chosen. A trade-off may exist between increasing decoding throughput, decreasing decoding complexity, and/or minimizing the decoder bit-error rate in an LDPC decoder (e.g., increasing the decoding throughput may require decreasing the decoding complexity and/or increasing the decoder bit-error rate). The checkerboard mother matrix structure may be chosen to provide the desired trade-off between these and other performance metrics. The features that may be chosen in step 1120 include the message length k, codeword length n, circulant matrix size $S_c$, the number of check node processor banks per circulant matrix $m_h$, the number of variable node processor banks per circulant matrix $m_v$, the division parameter D, the location of all-zero blocks, the location, size, and number of type-C circulants, and any other suitable design parameters. Including more type-C circulants at step 1120 may be advantageous in decreasing the symbol-error rate and/or bit-error rate of edge-based LDPC decoder 122. However, the inclusion of more type-C circulants may result in a lower decoding throughput, as additional processing time may be required to process these circulants.

At step 1130, a code design algorithm may be used to design a quasi-cyclic LDPC parity check code matrix under the checker-board mother matrix structure chosen in step 1120. There are many suitable code construction algorithms that could be used to design quasi-cyclic LDPC codes once the checker-board mother matrix is chosen. For example, density evolution, or variants thereof, can be used to obtain nearly-optimal variable and check node degree distributions given a checker-board structure (for example, the checker-board structure given in FIG. 6 or FIG. 8), and a modification of the progressive-edge-growth construction algorithm can be used to construct a matrix with the desired degree distribution and the desired checker-board structure.

At step 1140, the performance of LDPC code generated in step 1130 is tested, and the performance is determined to be either satisfactory or not satisfactory.

Performance testing of the LDPC code may be done, for example, in software, in hardware, or in a combination of a software and hardware. In software, customized performance evaluation tools may be used, as well as off-the-shelf analysis packages (for example, Matlab), in addition to any other suitable software tool or package. In hardware, a FPGA, an ASIC, or any other suitable hardware configuration may be used. There are many performance criteria that can be used to gauge the performance of the LDPC code. For example, waterfall region performance, error floor region performance, or both, may be used. Typical metrics of interest include the bit-error rate, symbol-error rate, sector-error rate, highest achievable information rate, and decoding complexity and/or delay. Further, each of these parameters may be affected by, among other factors, the SNR of the received signal. Performance may also be affected by choice of the maximum number of iterations $N_{it}$ used in the decoder.

Techniques for determining whether performance is satisfactory include comparing performance to a given threshold. Such a threshold may represent, for example, the maximum tolerable bit-error rate, maximum tolerable decoding delay, the minimum tolerable throughput, minimum tolerable achievable information rate, or a weighted combination of these factors in addition to other factors.

If the LDPC code has been determined to have satisfactory performance in step 1140, then it may be implemented at step 1150. Implementation may include a software-based implementation, a hardware-based implementation (e.g., in an FPGA or ASIC), or a combination thereof. If the LDPC code has been determined not to have satisfactory performance, then process 1100 returns to step 1120.

At step 1130 above, it may be possible to impose a degree column symmetry constraint in the code design that further simplifies the hardware implementation for LDPC codes that are irregular (this degree column symmetry constraint is automatically satisfied for LDPC codes that are regular as long as the number of circulant-columns in mother matrix 310 is even). If the degree column symmetry constraint is satisfied, it may be possible to simplify the hardware implementation of the LDPC decoder referred to at step 1130 by allowing the same processors to operate as type-A and type-B processors in different steps of the same or different decoding iterations. The degree column symmetry constraint may require that the number of degree-i variable nodes (i.e., degree-i columns) in mother matrix 310 be an even number for all i. In practice, this condition may not be able to be satisfied. In this case, the degree distribution for variable nodes may be selected to have as many even numbers as possible in the degree distribution vector (the degree distribution vector is the vector defining the number of columns of a certain degree in the mother matrix. This vector was previously defined as $\mu(x)$).

In other words, at step 1130, degree column symmetry constraint may be imposed so that, for all i, the number of columns in the mother matrix with degree i is $\mu_i \in \{0, 2, 4, 6, 8, \ldots\}$. This may be done, for example, by imposing this constraint in the optimization of the variable degree distribution in the density evolution optimizer.

If the degree column symmetry constraint is satisfied, variable nodes may be grouped so that vertical processors $P_{V_A}$ and $P_{V_B}$ (illustrated in FIGS. 6 and 8) correspond to the same number of degree-i nodes. With this degree column symmetry constraint, it may be possible to achieve symmetry in the mother matrix and the same hardware may be able to be used for processors operating as $P_{V_A}$ and $P_{V_B}$. The same degree-i processors may operate either as $P_{V_A}$ or $P_{V_B}$ in different clock cycles, e.g., the same degree-i processors may operate as $P_{V_A}$ in one clock cycle and as $P_{V_B}$ in another clock cycle. Since the number of degree-i nodes is even, for each node operating as a processor $P_{V_A}$ in a given clock cycle, there another node operates as processor $P_{V_B}$ in another clock cycle in another part of the decoding matrix. For example, in parity check matrix 600, for each symbol node corresponding to sub-block $H_1$ (and hence processed by processor $P_{V_A}$) there is another symbol node with the same column degree (this symbol node corresponds to sub-block $H_2$ and hence is processed by processor $P_{V_B}$). This is because there is an even number of symbol nodes with such a column degree. Hence, the hardware of degree-i node processors may be reused or shared. A similar degree row symmetry constraint may be imposed on check nodes. However, a degree row symmetry constraint may not always be necessary, since, in practice, most LDPC codes have an almost regular (i.e., concentrated) check node distribution.

Figure 12:
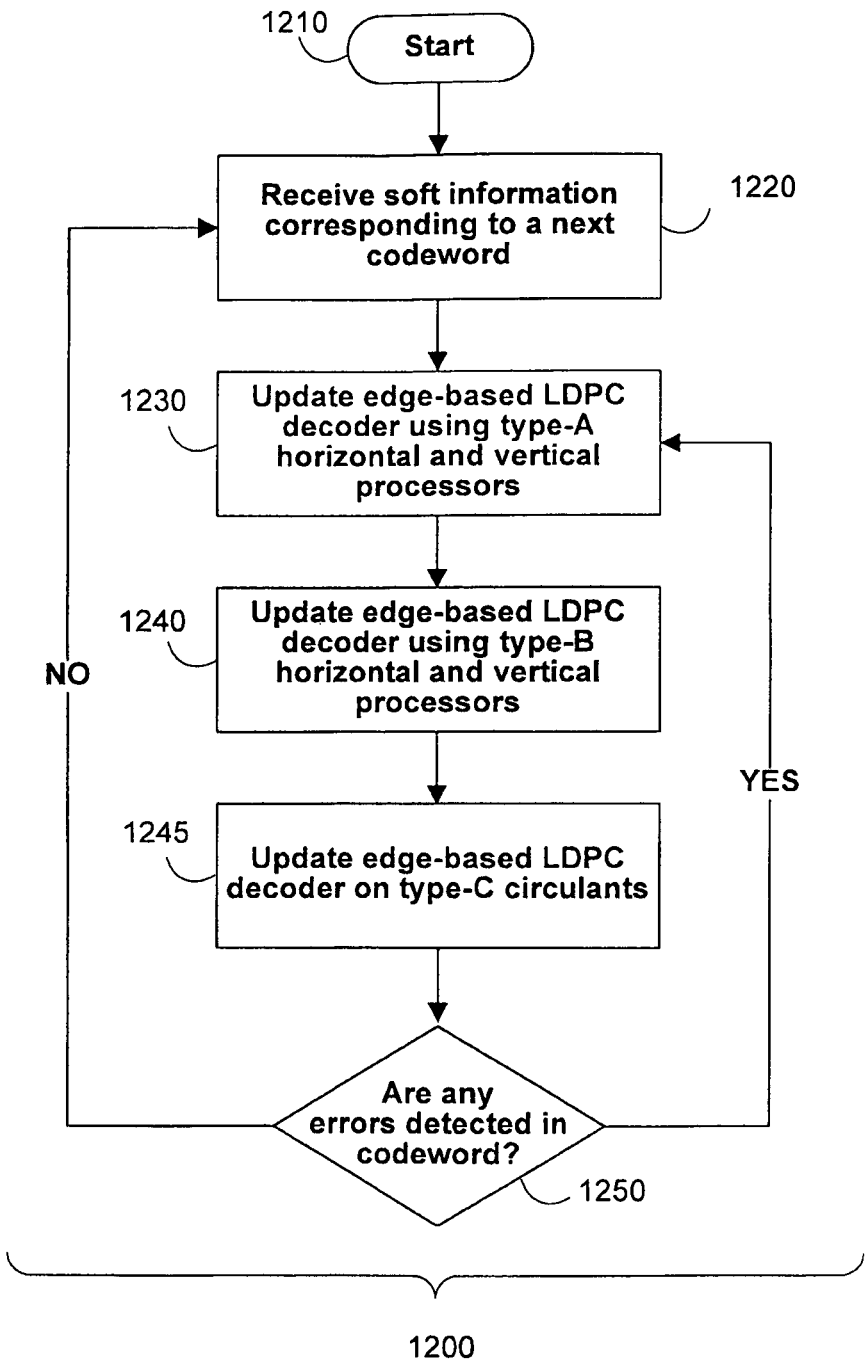
FIG. 12 shows a flow chart of an illustrative decoding process used by a checker-board edge-based LDPC decoder on a parity check.

FIG. 12 shows a flow chart of an illustrative decoding process used by a checker-board edge-based LDPC decoder such as decoder on the parity check matrix 600 (or equivalently parity check matrix 800) in accordance with some embodiments. Process 1200 may begin at step 1210. At step 1220, decoder of the checker-board parity check matrix 600 may received soft information 120 corresponding to codeword 108. Soft information 120 may correspond to a preliminary estimate of codeword 108, LLRs computed from received waveform 116, or to other information related to codeword 108.

At step 1230, decoder of the checker-board parity check matrix 600 may process received soft information according to a specified iterative decoding algorithm and using type-A horizontal processors 640 and type-A vertical processors 650 and 652, while keeping type-B processors 642, 654, and 656 inactive. For example, type-A processors 640, 650, and 652 may be used to update the stored content in memory blocks corresponding to matrix sub-blocks 610, 612, 614, and 616 based on the iterative decoding algorithm and the previous content stored in memory blocks corresponding to matrix sub-blocks 610 and 614 (updated by type-A processors 640) and in memory blocks corresponding to matrix sub-blocks 612 and 616 (updated by type-A processors 650 and 652, respectively) based on the iterative decoding algorithm and the previous content stored in memory blocks corresponding to matrix sub-blocks 610, 612, 614, and 616. At step 1240, decoder of the checker-board parity check matrix 600 may process received soft information according to a specified iterative decoding algorithm and using type-B horizontal processors 642 and type-B vertical processors 654 and 656, while keeping type-A processors 640, 650, and 652 inactive. For example, type-B processors 642, 654, and 656 may be used to update the stored content in memory blocks corresponding to matrix sub-blocks 612 and 616 (updated by type-B processors 642) and in memory blocks corresponding to matrix sub-blocks 610 and 614 (updated by type-B processors 654 and 656, respectively) based on the iterative decoding algorithm and the previous content stored in memory blocks corresponding to matrix sub-blocks 610, 612, 614, and 616. Steps 1230 and 1240 may be run using the time sequence shown in the timing diagram of FIG. 7, so that in the first time period of each iteration, only type-A horizontal and vertical processors are used, and the second time period of each iteration, only type-B horizontal and vertical processors are used. At step 1245, type-C circulants may be processed. For example, type-C circulants may be processed using a scheme similar or identical to the one described in timing diagram 900.

At step 1250, an estimate of codeword 108 may be generated using the data stored in the decoder of the checker-board parity check matrix 600. For example, an estimate of codeword 121 may be generated by determining the most likely value of codeword 108 based on the data (hard decisions) obtained by the decoder of the checker-board parity check matrix 600 after step 1245. This estimate of codeword 108 may be multiplied by parity check matrix 121 to determine if any errors are detected in the codeword. For example, according to one embodiment, if the matrix multiplication results in a zero vector then no syndrome errors are detected in the estimated codeword, and at least one error is detected otherwise. If no syndrome errors are detected, then step 1250 may output a message estimate 124 and process 1200 may return to step 1220, so that a next codeword may be detected. If at least one syndrome error is detected in the estimated codeword, process 1200 may return to step 1230 and perform a next iteration of the decoding algorithm as described above.

One skilled in the art will appreciate that the invention disclosed herein can be practiced by other than the described embodiments, which are presented for purposes of illustration and not of limitation, and the present invention is limited only by the claims that follow.

What is claimed is:

1. A method comprising:
receiving a codeword generated based on an LDPC code;
determining soft information based on the received codeword;
generating symbol node messages and parity check node messages based on the soft information; and
iteratively processing the symbol node messages and the parity check node messages, wherein each iteration comprises:
updating one or more symbol node messages in a first memory block simultaneously with updating one or more parity check node messages in a second memory block in a first time interval of the iteration,
updating one or more symbol node messages in the second memory block simultaneously with updating one or more parity check node messages in the first memory block in a second time interval of the iteration occurring after the first time interval of the iteration, and
updating, during a third time interval occurring after the first time interval and the second time interval, connector circulant messages in a connector circulant memory block located adjacent to the first memory block.

2. The method of claim 1, wherein said updating is performed using a checker-board matrix representation of the LDPC code.

3. The method of claim 2, wherein updating the checker-board matrix representation comprises:
selecting a number of type-C circulant matrices;
selecting a set of locations for the type-C circulant matrices; and
selecting a set of matrix dimensions for the type-C circulant matrices.

4. The method of claim 2, wherein each iteration further comprises:
accessing a first set of memory locations corresponding to symbol node messages and simultaneously accessing a second set of memory locations corresponding to parity check node messages; and
updating the messages contained in the first set of memory locations and the second set of memory locations based on an iterative decoding algorithm.

5. The method of claim 2, wherein the updating is performed based on a Tanner graph representation of the LDPC code.

6. The method of claim 5 wherein the updating is performed using a decoding algorithm selected from the group consisting of a min-sum decoding algorithm and a sum-product decoding algorithm.

7. A system for decoding a LDPC codeword comprising:
receiver circuitry configured to:
obtain a received codeword generated based on an LDPC code;
determine soft information based on the received codeword; and
generate symbol node messages and parity check node messages based on the soft information; and
a plurality of processors configured to:
iteratively process the symbol node messages and the parity check node messages, wherein each iteration comprises:
simultaneously updating one or more symbol node messages in a first memory block with one or more parity check node messages in a second memory block in a first time interval of the iteration;
simultaneously updating one or more symbol node messages in the second memory block with one or more parity check node messages in the first memory block in a second time interval of the iteration occurring after the first time interval of the iteration, and
updating, during a third time interval occurring after the first time interval and the second time interval, connector circulant messages in a connector circulant memory block located adjacent to the first memory block.

8. The system of claim 7, wherein each of the plurality of processors is further configured to perform one or more updates using a checker-board matrix structure comprising $[M_M \times M_N]$ circulant matrices wherein each circulant matrix is of size $[S_c \times S_c]$.

9. The system of claim 8, wherein the checker-board matrix structure further comprises a number of type-C circulant matrices.

10. The system of claim 9, wherein the plurality of processors comprises a first set of horizontal processors and vertical processors and a second set of horizontal processors and vertical processors.

11. The system of claim 10, wherein one or more processors in the plurality of processors are assigned to the first set of horizontal and vertical processors in a first set of time periods and are assigned to the second set of horizontal and vertical processors in a second set of time periods.

12. The system of claim 10, wherein the first set of horizontal processors and vertical processors and the second set of horizontal processors and vertical processors are further configured to perform the one or more updates using an iterative decoding algorithm.

13. The system of claim 10, wherein a set of processors are used to process a portion of the type-C circulant matrices in time periods separate from the time periods in which the one or more symbol node messages and the one or more parity check node messages are processed.

14. The system of claim 10, wherein the type-C circulant matrices further comprise an amount of temporary memory storage, and wherein:
    a first processor stores a message read from an original memory location in the temporary storage;
    a horizontal processor reads the stored message from the temporary storage and processes the stored message; and
    the horizontal processor writes the processed stored message into the original memory location.

15. The system of claim 10, wherein:
    the first set of horizontal processors and vertical processors comprises:
        $m_h$ horizontal processors running in parallel and used to access the memory locations in each circulant matrix having an odd numbered row index; and
        $m_v$ vertical processors running in parallel and used to access the memory locations in each circulant matrix having an even numbered column index; and
    the second set of horizontal processors and vertical processors comprises:
        $m_h$ horizontal processors running in parallel and used to access the memory locations in each circulant matrix having an even numbered row index; and
        $m_v$ vertical processors running in parallel and used to access the memory locations in each circulant matrix having an odd numbered column index.

16. Apparatus for decoding a LDPC codeword comprising:
    means for obtaining a received codeword generated based on an LDPC code;
    means for determining soft information based on the received codeword;
    means for generating symbol node messages and parity check node messages based on the soft information; and
    means for iteratively processing the symbol node messages and the parity check node messages, wherein each iteration comprises:
        updating one or more symbol node messages in a first memory block simultaneously with updating one or more parity check node messages in a second memory block in a first time interval of the iteration,
        updating one or more symbol node messages in the second memory block simultaneously with updating one or more parity check node messages in the first memory block in a second time interval of the iteration occurring after the first time interval of the iteration, and
        updating, during a third time interval occurring after the first time interval and the second time interval, connector circulant messages in a connector circulant memory block located adjacent to the first memory block.

17. The apparatus of claim 16, further comprising means for performing said updating using a checker-board matrix representation of the LDPC code.

18. The apparatus of claim 16, wherein each iteration further comprises:
    means for accessing a first set of memory locations corresponding to symbol node messages and simultaneously accessing a second set of memory locations corresponding to parity check node messages; and
    means for updating the messages contained in the first set of memory locations and the second set of memory locations based on an iterative decoding algorithm.

\* \* \* \* \*